United States Patent
Jokura

(10) Patent No.: US 6,173,025 B1
(45) Date of Patent: Jan. 9, 2001

(54) PLL FREQUENCY SYNTHESIZER USING FREQUENCY DIVIDERS RESET BY INITIAL PHASE DIFFERENCE

(75) Inventor: Jun Jokura, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/070,245

(22) Filed: May 1, 1998

(30) Foreign Application Priority Data

May 2, 1997 (JP) .................................................. 9-130284

(51) Int. Cl.$^7$ ........................................................ H03D 3/24
(52) U.S. Cl. ........................ 375/376; 375/374; 375/375; 327/147; 327/156; 327/160
(58) Field of Search .................. 375/376, 373, 375/374, 375; 327/147, 148, 156, 157, 160

(56) References Cited

U.S. PATENT DOCUMENTS

| | | | |
|---|---|---|---|
| 4,980,652 | * 12/1990 | Tarusawa et al. | 331/1 A |
| 5,036,216 | * 7/1991 | Hohmann et al. | 331/25 |
| 5,202,906 | * 4/1993 | Saito et al. | 331/14 |
| 5,471,187 | * 11/1995 | Hansen et al. | 340/146.2 |
| 5,497,126 | * 3/1996 | Kosiec et al. | 331/1 A |

FOREIGN PATENT DOCUMENTS

| | | |
|---|---|---|
| 2 207 309 | 1/1989 | (GB) . |
| 2 236 922 | 4/1991 | (GB) . |
| 2 258 960 | 2/1993 | (GB) . |
| 55-92043 | 7/1980 | (JP) . |
| 60-248022 | 7/1985 | (JP) . |
| 61-258529 | 11/1986 | (JP) . |
| 63-290019 | 11/1988 | (JP) . |
| 64-34017 | 2/1989 | (JP) . |
| 64-1330 | 5/1989 | (JP) . |
| 2-33218 | 2/1990 | (JP) . |
| 3-18122 | 1/1991 | (JP) . |
| 3-226012 | 10/1991 | (JP) . |
| 3-235522 | 10/1991 | (JP) . |
| 5-48450 | 2/1993 | (JP) . |
| 6-152405 | 5/1994 | (JP) . |
| 6-311032 | 11/1994 | (JP) . |
| 7-3418 | 1/1995 | (JP) . |
| 7-86931 | 3/1995 | (JP) . |
| 7-95065 | 4/1995 | (JP) . |

OTHER PUBLICATIONS

Search Report dated Oct. 27, 1998.

* cited by examiner

Primary Examiner—Stephen Chin
Assistant Examiner—Mohammad Ghayour
(74) Attorney, Agent, or Firm—McGinn & Gibb, PLLC

(57) ABSTRACT

In a frequency synthesizer, a first, constant frequency divider is connected to a reference frequency oscillator, and a second, variable frequency divider is connected to a voltage-controlled oscillator. A phase difference is detected by a phase detector between the frequency dividers and a first output pulse or a second output pulse is produced when the second frequency divider is leading or lagging the first frequency divider. A charge pump integrates the first and second output pulses to supply a phase difference signal to a lowpass filter which drives rates the voltage-controlled oscillator. An initial phase difference which occurs between the frequency dividers immediately after they are energized is detected and one of the frequency dividers is reset with the detected phase difference to align their phase. As long as the initial phase difference is detected, the passages of the first and second output pulses to the charge pump are blocked.

7 Claims, 4 Drawing Sheets

PHASE LEAD

PHASE LAG

PLL FREQUENCY SYNTHESIZER USING FREQUENCY DIVIDERS RESET BY INITIAL PHASE DIFFERENCE

BACKGROUND OF THE INVENTION

1. Field of the Invention

The present invention relates generally to phase-locked loop frequency synthesizers and more specifically, the invention relates to implementation of a PLL frequency synthesizer capable of fast lock-in operation at the instant immediately after frequency dividers are energized to operate a voltage controlled oscillator in a closed-loop mode. The present invention is particularly suitable for power saving PLL frequency synthesizers.

2. Description of the Related Art

Fast lock-in capability is an important feature of a phase-locked loop regardless of its application in order to recover from an out-of-phase condition. Power saving is another important feature of the phase-locked loop if it is used in portable radio receivers. Since power consumption of a PLL frequency synthesizer of a radio receiver accounts for a substantial proportion of its total power, battery supply of its two frequency dividers is periodically interrupted to operate its voltage-controlled oscillator in an open-loop mode. As shown and described in Japanese Laid-Open Patent Specification Sho-60-248022, energy stored in the lowpass (loop) filter during a closed-loop mode is utilized during the next open-loop mode to enable the VCO to produce its output. During the closed-loop mode, the input signals of the phase detector must be resynchronized, or locked in phase to each other even if they are synchronized in frequency. Since longer the time it takes for the closed-loop mode to resynchronize the shorter the time allowed for the open-loop mode to continue, it is desirable from the power savings view point that the two frequency dividers are locked in phase as quickly as possible.

Japanese Laid-Open Patent Specification Sho-64-1330 discloses a fast lock-in power-saving PLL frequency synthesizer whose resynchronization process is controlled by the use of two gate circuits as illustrated in FIG. 1. One of the gate circuits, indicated at 2, is connected in the circuit between a quartz oscillator 1 and a divided-by-M frequency divider 3, the other gate circuit 8 being connected in the circuit between a voltage-controlled oscillator 7 and a divide-by-N frequency divider 9. The scaling factor M is constant, while the scaling factor N is variable in accordance with an externally supplied frequency (channel) control signal. The phase difference between the outputs of the frequency dividers 3 and 9 is detected by a phase detector 4 and supplied through a switch 5 and a lowpass filter 7 to the VCO 7. To the outputs of the frequency dividers is connected a control circuit 10 to which power saving pulses are supplied from an external source. Although not shown in FIG. 1, power supply to the frequency dividers 3 and 9 is cut off and the switch 5 is turned off to operate the VCO 7 in an open-loop mode. Immediately after the frequency dividers are activated again, but before the switch 5 is turned on to operate the VCO in a closed loop mode, the control circuit 10 determines whether the frequency divider 9 is lagging or leading with respect to the frequency divider 3. Control circuit 10 turns off the gate circuit 2 if the divider 9 is lagging and turns off the gate circuit 8 if it is advancing. The length of the turn-off time of these gate circuits is determined so that the inputs of the phase detector 4 are aligned in phase with each other.

However, when one of the gate circuits is turned off, there is a possibility of one of the frequency dividers producing at least one error count, and there is also a possibility of another error count when the gate circuit is turned on. In the prior art, there is a likelihood of the occurrence of a maximum initial phase difference of two cycles. Therefore, the prior art approach is still not sufficient for fast lock-in operation because of imprecision timing control of the gate circuits.

SUMMARY OF THE INVENTION

It is therefore an object of the present invention to provide a PLL frequency synthesizer capable of fast lock-in operation with precision.

According to a first aspect, the present invention provides a phase-locked loop frequency synthesizer comprising a reference frequency oscillator, a first resettable frequency divider having a fixed scaling factor connected to the reference frequency oscillator, a voltage-controlled oscillator, and a second resettable frequency divider having a variable scaling factor connected to the voltage-controlled oscillator. A phase difference is detected by a phase detector between the first and second frequency dividers and a first output pulse representative of the phase difference is produced when the second frequency divider is leading and a second output pulse representative of the phase difference is produced when the second frequency divider is lagging. A charge integrating circuit integrates the first and second output pulses to supply a phase difference signal to a lowpass filter which filters out high frequency components of the phase difference signal and operates the voltage-controlled oscillator. A control circuit is responsive to the first and second output pulses of the phase detector for detecting an initial phase difference which occurs between the first and second frequency dividers immediately after the instant the first and second frequency dividers are energized and resetting one of the first and second frequency dividers so that the frequency dividers are aligned in phase. A gate circuit is connected between the phase detector and the charge integrating circuit for blocking the passages of the first and second output pulses of the phase detector to the charge integrating circuit when the initial phase difference is detected by the control circuit.

According to a second aspect, the present invention provides a phase-locked loop frequency synthesizer comprising a reference frequency oscillator, a first resettable frequency divider having a fixed scaling factor connected to the reference frequency oscillator, a voltage-controlled oscillator, and a second resettable frequency divider having a variable scaling factor connected to the voltage-controlled oscillator. A phase difference is detected by a phase detector between the first and second frequency dividers and a first output pulse representative of the phase difference is produced when the second frequency divider is leading and a second output pulse representative of the phase difference is produced when the second frequency divider is lagging. A charge integrating circuit integrates the first and second output pulses to supply a phase difference signal to a lowpass filter which filters out high frequency components of the phase difference signal and operates the voltage-controlled oscillator. A first switch is provided for establishing a connection between the charge integrating circuit and the lowpass filter when it is turned on to operate the frequency synthesizer in a closed-loop mode and clearing the connection when the it is turned off to operate the frequency synthesizer in an open-loop mode. A second switch supplies power to the first and second frequency dividers during the closed-loop mode and interrupts the power during the open-loop mode. A control circuit is responsive to the first and second output pulses of the phase detector for detecting an initial phase difference which occurs between the first and second frequency dividers immediately after the frequency synthesizer enters the closed-loop mode and resetting one of the first and second frequency dividers so that the frequency dividers are aligned in phase. A gate circuit is connected between the phase detector and the charge integrating circuit for blocking the passages of the first and second output pulses of the phase detector to the charge integrating circuit when the initial phase difference is detected by the control circuit.

BRIEF DESCRIPTION OF THE DRAWINGS

The present invention will be described in further detail with reference to the accompanying drawings, in which.

DETAILED DESCRIPTION

Figure 1:
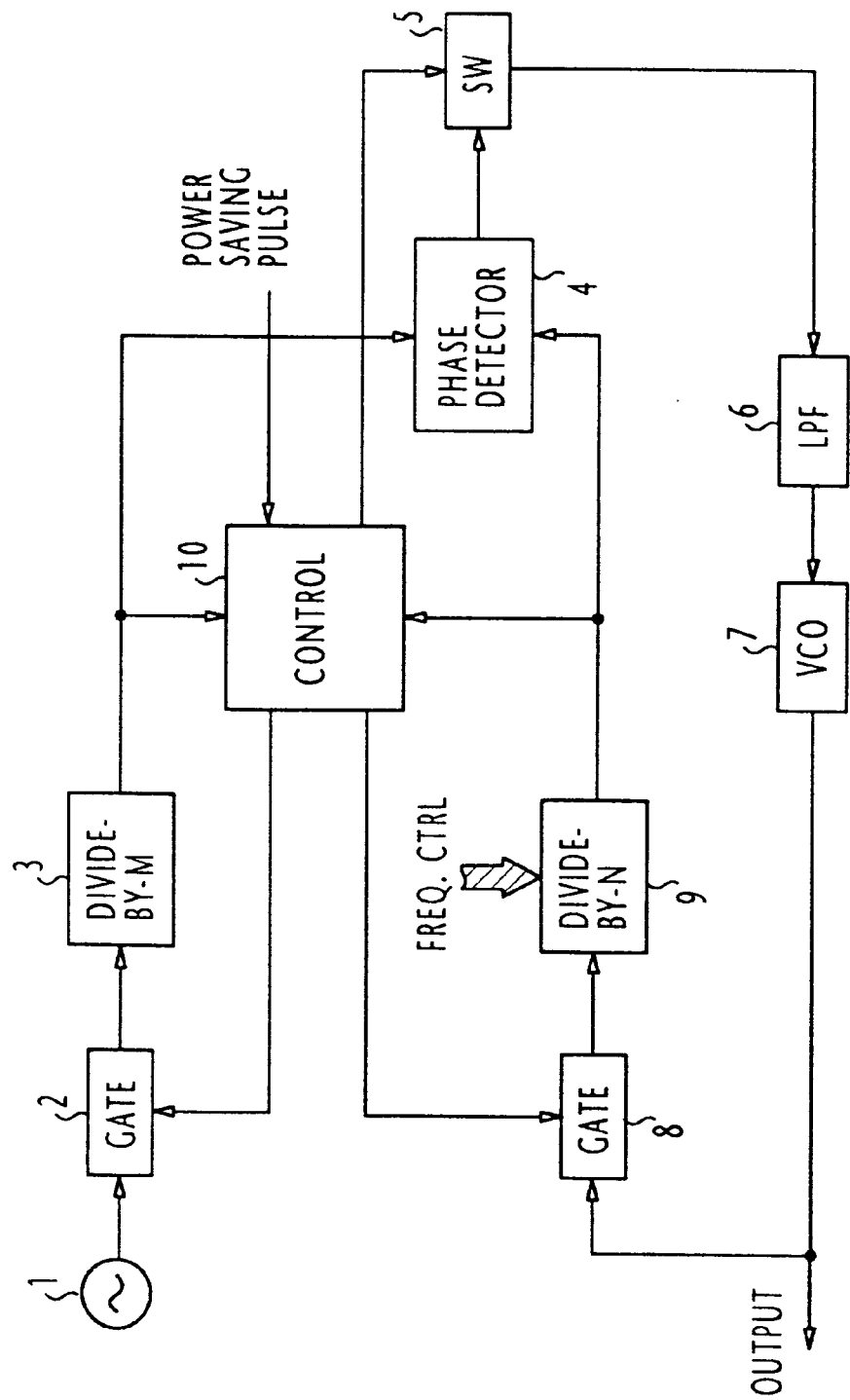
FIG. 1 is a block diagram of a prior art PLL frequency synthesizer.
Figure 2:
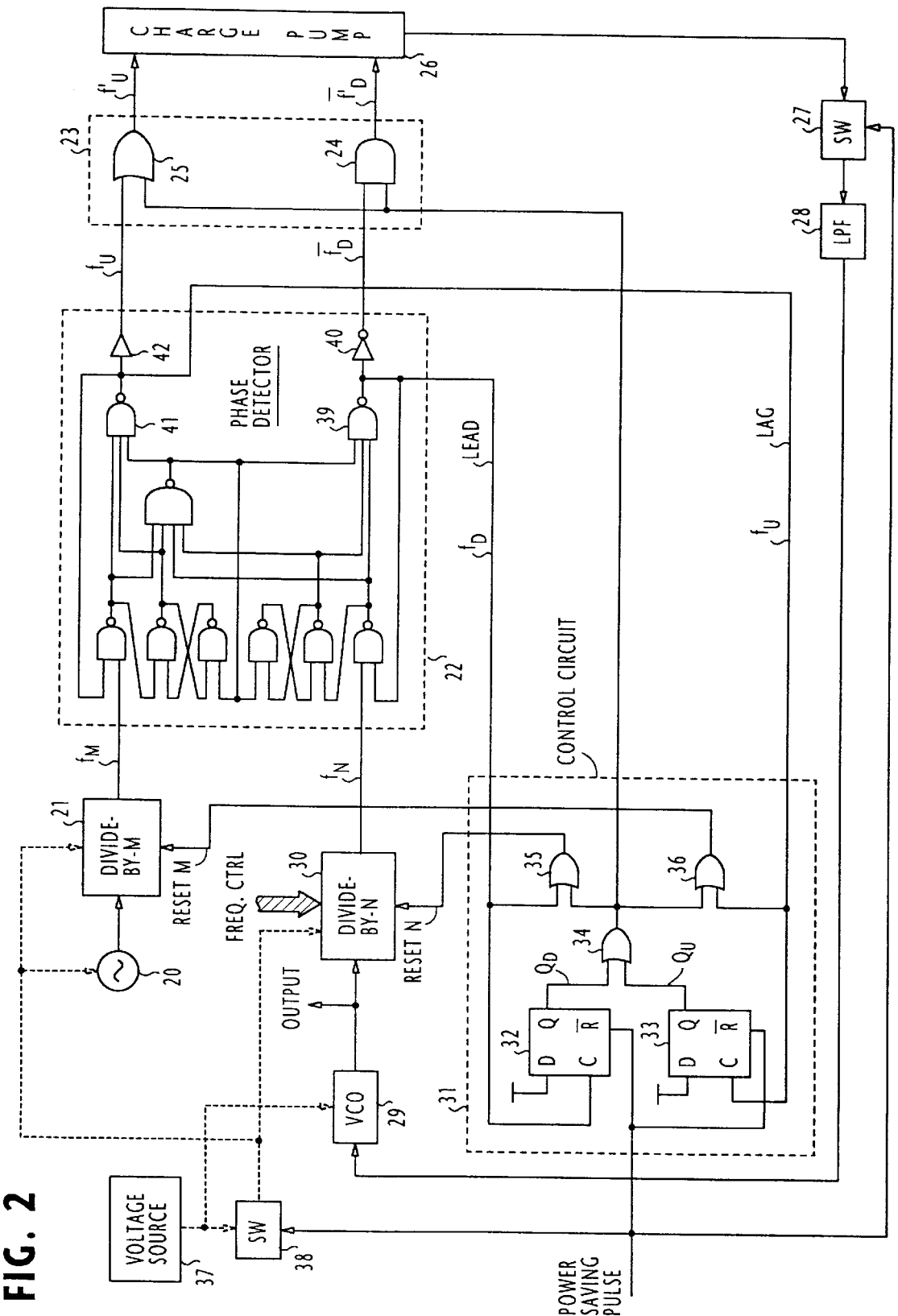
FIG. 2 is a block diagram of a PLL frequency synthesizer of the present invention.

In FIG. 2, a phase-locked loop (PLL) frequency synthesizer according to the present invention has a reference frequency oscillator 20, a resettable divide-by-M frequency divider 21 connected to the oscillator to produce a constant frequency pulse $f_M$ and a resettable divide-by-N variable frequency divider 30 which produces a variable frequency pulse $f_N$ according to a frequency control signal applied thereto. The outputs of the frequency dividers are supplied to a phase detector 22 to detect the phase difference between the leading edges of its input pulses to produce a phase lead signal at the output of an AND gate 39 or a phase lag signal at the output of an AND gate 41. More specifically, when the variable frequency signal $f_N$ leads the reference phase, a negative pulse $f_D$ is produced by the AND gate 39 and when it lags, a negative pulse $f_U$ is produced by the AND gate 41. When there is no phase difference, both of the phase lead and lag signals are high (logic-1 level).

According to the present invention, the outputs of AND gates 39 and 41 are supplied to a control circuit 31 to detect an initial phase difference which occurs when the frequency dividers are reactivated. The outputs of these AND gates are further supplied via OR gates 35 and 36 of the control circuit to the reset terminals of frequency dividers 30 and 21, respectively, when the initial phase difference is detected.

A gate circuit 23 is connected between the phase detector 22 and a charge pump 26. When the PLL frequency synthesizer enters a closed-loop mode, there is some initial phase difference between signals $f_M$ and $f_N$, and hence there is an initial negative pulse $f_U$ or an initial negative pulse $f_D$ immediately after the frequency dividers are energized again to operate the VCO in closed-loop mode. In the present invention, the initial phase difference is precisely detected to achieve fast lock-in operation so that the frequency synthesizer is allowed to operate in short closed-loop modes and long open-loop (power saving) modes.

The output of AND gate 39 is amplified by a unity-gain inverting amplifier 40 and the output of AND gate 41 is amplified by a unity-gain noninverting amplifier 42. The output of amplifier 40 is supplied to the gate circuit 23 as a complementary output $\bar{f}_D$ of the phase detector 22 and the output of amplifier 42 is supplied to the gate circuit 23 as a true output $f_U$ of the phase detector 22. Phase lead and phase lag are thus represented at the outputs of amplifiers 40 and 42 by a positive pulse $\bar{f}_D$ and a negative pulse $f_U$, respectively.

As will be described, a phase lead or lag pulse occurs immediately after the mode-control switch 27 is turned on. This phase difference is called an initial phase difference, which is blocked off by the gate circuit 26. Gate circuit 26 comprises an AND gate 24 and an OR gate 25 to which are supplied a control signal is supplied from an OR gate 34 of the control circuit 31 and the output signals of amplifiers 40 and 42. Gate circuit 23 is turned off when the gate control signal is low. More specifically, when the gate control signal is low, the AND gate 24 is disabled to prevent the passage of the positive phase lead pulse $\bar{f}_D$ and the OR gate 25 is disabled to prevent the passage of the negative phase lag pulse $f_U$. When the gate control signal is high, the AND gate 24 produces positive pulses $\bar{f}_D$ if variable frequency signal $f_N$ leads the reference signal and the OR gate 25 produces negative pulses $f_U$ when it lags the reference signal.

Charge pump 26 is essentially a charge integrating circuit whose output goes high in response to the positive phase lead pulses $\bar{f}_D$ and goes low in response to the negative phase lag pulses $f_U$.

The output of the charge pump 26 is supplied via a switch 27 to a lowpass filter 28 where the high-frequency components of the output of the charge pump are filtered out. The output of the lowpass filter 28 is used to control the voltage-controlled oscillator 29. Variable frequency divider 30 is driven by the VCO 29 and whose scaling factor N is controlled by a channel control signal supplied from an external source, not shown.

Control circuit 31 includes a pair of D-type flip-flops 32 and 33. The D inputs of both flip-flops are biased at a high voltage level. The negative phase lead pulses $f_D$ from phase detector 22 are used as a clock input of the flip-flop 32 and the negative phase lag pulses $f_U$ are used as a clock input of the flip-flop 33. The Q outputs of both flip-flops are connected to the OR gate 34, whose output is coupled to the first inputs of OR gates 35 and 36. The second inputs of OR gates 35 and 36 are connected to receive the pulses $f_D$ and $f_U$, respectively, from the phase detector.

Power saving signal is supplied to the mode-control switch 27. When the power saving signal is low, the switch 27 is turned off to block the passage of the output of charge pump 26 to the lowpass filter 28 so that the frequency synthesizer operates in an open-loop mode. The power saving pulse is also supplied to a power-control switch 38 to turn it off during the open-loop mode.

During the open-loop mode, the power supply from voltage source 37 to the reference frequency oscillator 20 and the frequency dividers 21 and 30 is cut off by the switch 38 to save their power consumption. However, the VCO 29 is directly connected to the voltage source 37 to maintain its operation during the open-loop mode by using the energy which was stored in the lowpass filter 28 at the time the switch 27 was turned off Therefore, if the outputs of frequency dividers 21 and 30 are aligned in phase at the time the switch 27 was turned off, the VCO 29 will continue to produce the same phase-aligned output during the open-loop mode.

Figure 3A:
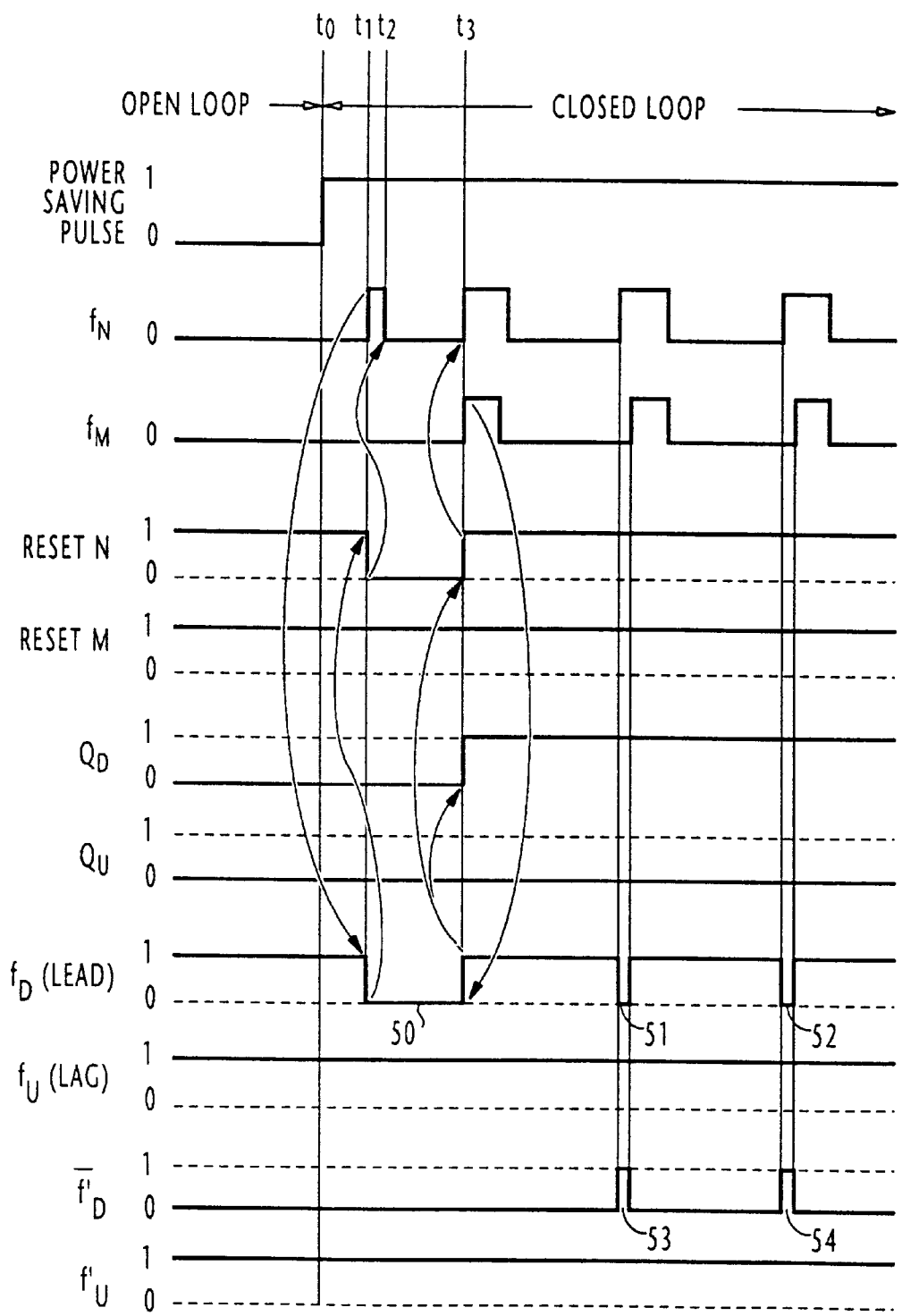
FIG. 3A is a timing diagram illustrating the operation of the frequency synthesizer when the output of a variable frequency divider leads the reference phase immediately after the frequency synthesizer changes from open-loop to closed-loop operation.
Figure 3B:
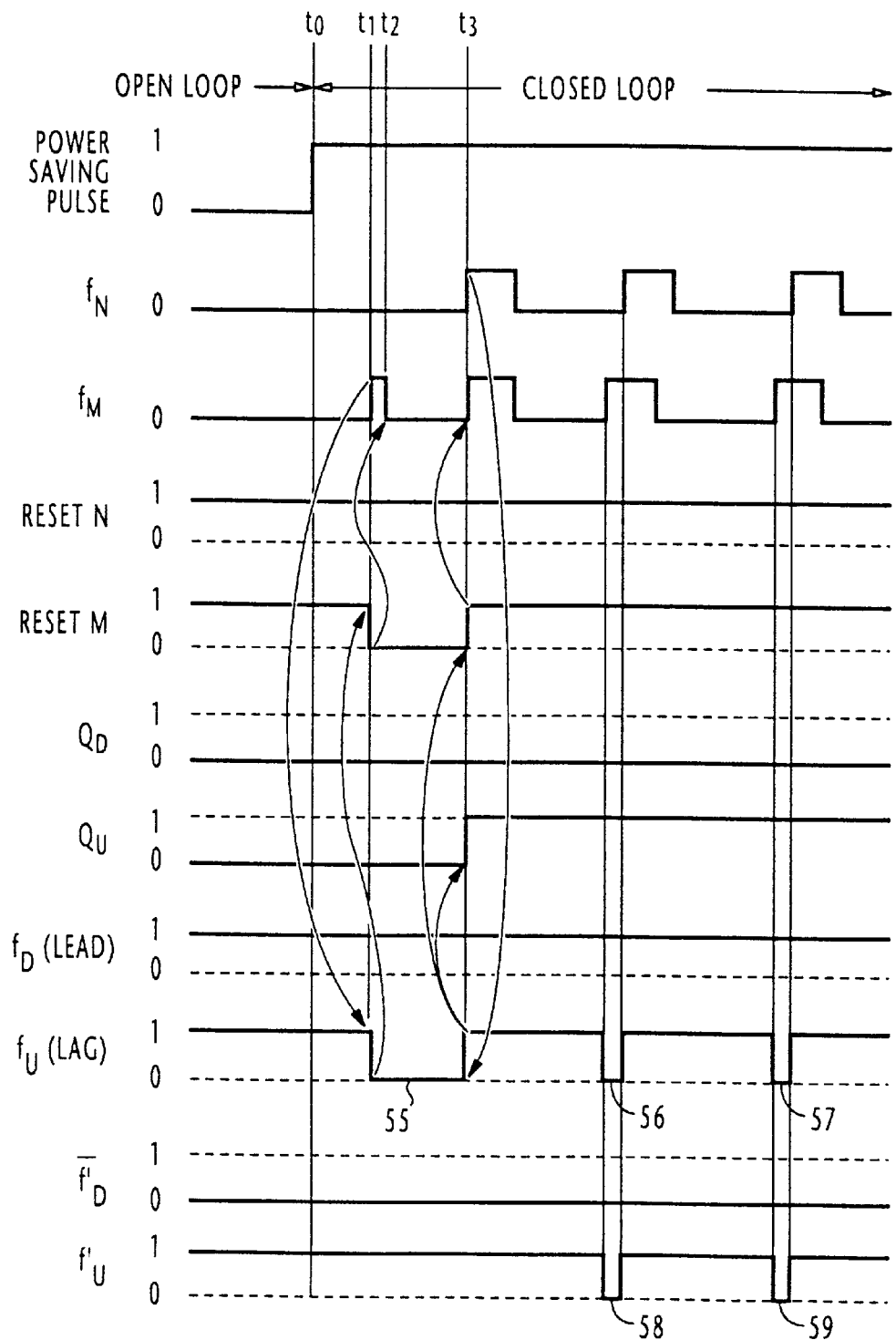
FIG. 3B is a timing diagram illustrating the operation of the frequency synthesizer when the output of the variable frequency divider lags the reference phase during the initial period of the closed-loop operation.

The operation of the PLL frequency synthesizer of this invention will be better understood with the following description with the aid of the timing diagrams of FIGS. 3A and 3B, which illustrate a series of events that occur when the variable frequency divider 30 leads and lags the reference phase, respectively.

In FIG. 3A, when the power saving pulse is at low level, the switches 27 and 38 are turned off and the outputs of the frequency dividers 21 and 30 are maintained at low logic level and the phase lead output $f_D$ and phase lag output $f_U$ of phase detector 22 are high logic level. The power saving signal is also supplied to the reset terminals of flip-flops 32, 33 of the control circuit 31. Thus, in the open-loop mode, the Q outputs of flip-flops 32 and 33 are both maintained at high logic level and the reset terminals of both frequency dividers are maintained at high logic level.

When the power saving pulse goes high at time to and the frequency synthesizer enters a closed-loop mode, the frequency dividers 21 and 30 restart producing output pulses. Since it is assumed that the variable frequency divider 30 leads the reference phase, the output $f_N$ of this frequency divider is the first to go high at time $t_1$. This causes the phase lead output $f_D$ of phase detector 22 to go low, causing the reset terminal of the advancing frequency divider 30 to go low. Thus, frequency divider 30 is reset and its output $f_N$ goes low at time $t_2$.

If the first output pulse $f_M$ of frequency divider 21 is produced at time $t_3$, the phase lead output $f_D$ of the phase detector 22 and hence the reset terminal of frequency divider 30 goes high. Phase detector 22 thus produced a negative phase lead pulse 50 whose duration is equal to the phase difference (i.e., $t_1$ and $t_3$) between the leading edges of the initial output pulses of frequency dividers. As a result, the variable frequency divider 30 is reset until the frequency divider 21 produces its first output pulse and both frequency dividers are precisely aligned in phase at time $t_3$.

Flip-flop 32 responds to the high level clock input $f_D$ by changing its output $Q_D$ to high logic level. This high logic level is applied through OR gate 34 to OR gate 35 to prevent the frequency divider 30 from being reset by negative lead pulses 51 and 42 which may subsequently occur during this closed loop mode. Because of the high logic level of the flip-flip output $Q_D$, the output of OR gate 34 is maintained at high level to disable the AND gate 24 of gate circuit 23. The negative phase lead pulse 50 is thus blocked off by the AND gate 24, allowing only effective negative lead pulses 51 and 42 of phase detector 22 to appear at the output of AND gate 24 as positive phase lead pulses 53 and 54.

It is seen therefore that the initial phase difference is not reflected in the closed loop operation of the frequency synthesizer. Rather, the closed loop operation proceeds according to a frequency difference which may exist between the two frequency dividers after their phases are precisely aligned with each other at time $t_3$.

Similar events occur when the variable frequency divider 30 initially lags the reference phase immediately after the frequency synthesizer entered a closed loop mode. In this case, the output $f_M$ of frequency divider 21 is the first to go high at time $t_1$ as shown in FIG. 3B. This causes the phase lag output $f_U$ of phase detector 22 to go low, causing the reset terminal of the advancing frequency divider 21 to go low. Thus, frequency divider 21 is reset and its output $f_M$ goes low at time $t_2$.

If the first output pulse $f_N$ of the variable frequency divider is produced at time $t_3$, the phase lag output $f_U$ of the phase detector 22 and hence the reset terminal of frequency divider 21 goes high. Phase detector 22 thus produced a negative phase lead pulse 55 whose duration is equal to the phase difference (i.e., $t_1$ and $t_3$) between the leading edges of the initial output pulses of frequency dividers. As a result, the frequency divider 21 is reset until the frequency divider 30 produces its first output pulse and both frequency dividers are precisely aligned in phase at time $t_3$.

Flip-flop 33 responds to the high level clock input $f_U$ by changing its output $Q_U$ to high logic level. This high logic level is applied through OR gate 34 to OR gate 36 to prevent the frequency divider 21 from being reset by negative lag pulses 56 and 57 which may subsequently occur during this closed loop mode. Because of the high logic level of the flip-flip output $Q_U$, the output of OR gate 34 is maintained at high level to disable the OR gate 25 of gate circuit 23. The negative phase lead pulse 55 is thus blocked off by the OR gate 25, allowing only effective negative lag pulses 56 and 57 to appear at the output of OR gate 25 as negative pulses 58 and 59.

What is claimed is:

1. A phase-locked loop frequency synthesizer comprising:
   a reference frequency oscillator;
   a first resettable frequency divider having a fixed scaling factor connected to the reference frequency oscillator;
   a voltage-controlled oscillator;
   a second resettable frequency divider having a variable scaling factor connected to the voltage-controlled oscillator;
   a phase detector for detecting a phase difference between the first and second frequency dividers and producing a first output pulse representative of the phase difference when said second frequency divider is leading and a second output pulse representative of the phase difference when said second frequency divider is lagging;
   a charge integrating circuit for integrating said first and second output pulses to produce a phase difference signal;
   a lowpass filter for filtering out high frequency components of the phase difference signal and operating said voltage-controlled oscillator;
   a control circuit responsive to the first and second output pulses of the phase detector for detecting an initial phase difference which occurs between said first and second frequency dividers immediately after the instant the first and second frequency dividers are energized and resetting one of the first and second frequency dividers so that said frequency dividers are aligned in phase; and
   a gate circuit connected between the phase detector and the charge integrating circuit for preventing said first and second output pulses of the phase detector from being applied to the charge integrating circuit when the initial phase difference is detected by the control circuit.

2. A phase-locked loop frequency synthesizer as claimed in claim 1, wherein said control circuit is arranged to reset the second frequency divider when the phase detector produces said first output pulse and reset the first frequency divider when the phase detector produces said second output pulse.

3. A phase-locked loop frequency synthesizer comprising:
   a reference frequency oscillator;
   a first resettable frequency divider having a fixed scaling factor connected to the reference frequency oscillator;

a voltage-controlled oscillator;

a second resettable frequency divider having a variable scaling factor connected to the voltage-controlled oscillator;

a phase detector for detecting a phase difference between the first and second frequency dividers and producing a first output pulse representative of the phase difference when said second frequency divider is leading and a second output pulse representative of the phase difference when said second frequency divider is lagging;

a charge integrating circuit for integrating said first and second output pulses to produce a phase difference signal;

lowpass filter for filtering out high frequency components of the phase difference signal and operating said voltage-controlled oscillator;

a first switch for establishing a connection between the charge integrating circuit and the lowpass filter when the first switch is turned on to operate the frequency synthesizer in a closed-loop mode and clearing the connection when the switch is turned off to operate the frequency synthesizer in an open-loop mode;

a second switch for supplying power to the first and second frequency dividers during said closed-loop mode and interrupting the power during said open-loop mode;

control circuit responsive to the first and second output pulses of the phase detector for detecting an initial phase difference which occurs between said first and second frequency dividers immediately after the frequency synthesizer enters the closed-loop mode and resetting one of the first and second frequency dividers so that said frequency dividers are aligned in phase; and a gate circuit connected between the phase detector and the charge integrating circuit for preventing said first and second output pulses of the phase detector from being applied to the charge integrating circuit when the initial phase difference is detected by the control circuit.

4. A phase-locked loop frequency synthesizer as claimed in claim 3, wherein said control circuit is arranged to reset the second frequency divider when the phase detector produces said first output pulse and reset the first frequency divider when the phase detector produces said second output pulse.

5. A phase-locked loop frequency synthesizer as claimed in claim 3, wherein said first and second switches are operated in response to a power saving pulse, and wherein said control circuit is responsive to the power saving pulse for detecting said initial phase difference when said first and second output pulses of the phase detector occur immediately after the instant said first and second switches are turned on by said power saving pulse.

6. A phase-locked loop frequency synthesizer as claimed in claim 5, wherein said control circuit comprises:

a first gate for coupling the first output pulse of the phase detector as a reset pulse to the second frequency divider;

a second gate for coupling the second output pulse of the phase detector as a reset pulse to the first frequency divider; and means responsive to said power saving pulse and said first and second output pulses of the phase detector for disabling said first and second gates after one of said first and second frequency dividers is reset.

7. A method for controlling a phase-locked loop frequency synthesizer wherein the frequency synthesizer comprises a reference frequency oscillator, a first resettable frequency divider having a fixed scaling factor connected to the reference frequency oscillator, a voltage-controlled oscillator, and a second resettable frequency divider having a variable scaling factor connected to the voltage-controlled oscillator, a phase detector for detecting a phase difference between the first and second frequency dividers and producing a first output pulse representative of the phase difference when said second frequency divider is leading and a second output pulse representative of the phase difference when said second frequency divider is lagging, and a charge integrating circuit for integrating said first and second output pulses to produce a phase difference signal, the method comprising:

a) filtering out high frequency components of the phase difference signal and operating said voltage-controlled oscillator;

b) detecting an initial phase difference which occurs between said first and second frequency dividers immediately after the instant the first and second frequency dividers are energized;

c) resetting one of the first and second frequency dividers when said initial phase difference is being detected so that said frequency dividers are aligned in phase; and d) preventing said first and second output pulses of the phase detector from being applied to the charge integrating circuit when the initial phase difference is being detected by the step (b).

* * * * *